(12) United States Patent
Ito

(10) Patent No.: US 7,303,978 B2
(45) Date of Patent: Dec. 4, 2007

(54) BOARD FOR MOUNTING BGA SEMICONDUCTOR CHIP THEREON, SEMICONDUCTOR DEVICE, AND METHODS OF FABRICATING SUCH BOARD AND SEMICONDUCTOR DEVICE

(75) Inventor: Toshihide Ito, Shimoniikawa-gun (JP)

(73) Assignee: NEC Toppan Circuit Solutions, Inc., Tokyo (JP)

( * ) Notice: Subject to any disclaimer, the term of this patent is extended or adjusted under 35 U.S.C. 154(b) by 344 days.

(21) Appl. No.: 11/029,676

(22) Filed: Jan. 6, 2005

(65) Prior Publication Data
US 2005/0156326 A1 Jul. 21, 2005

Related U.S. Application Data

(62) Division of application No. 10/349,975, filed on Jan. 24, 2003, now abandoned.

(30) Foreign Application Priority Data

Feb. 1, 2002 (JP) ............................. 2002-025528

(51) Int. Cl.
*H01L 21/00* (2006.01)
*H01L 21/44* (2006.01)
(52) U.S. Cl. .................. 438/464; 438/106; 438/108; 438/114; 438/160; 438/613; 438/614
(58) Field of Classification Search .................... None
See application file for complete search history.

(56) References Cited

U.S. PATENT DOCUMENTS 5,976,912 A * 11/1999 Fukutomi et al. ........... 438/110

| 6,228,466 B1 * | 5/2001 | Tsukada et al. ............. 428/209 |
| 6,379,159 B1 * | 4/2002 | Mune et al. .................. 439/71 |
| 6,476,331 B1 | 11/2002 | Kim et al. |
| 6,492,252 B1 * | 12/2002 | Lin et al. ..................... 438/612 |

(Continued)

FOREIGN PATENT DOCUMENTS

JP 10-074856 A 3/1998

(Continued)

*Primary Examiner*—Carl Whitehead, Jr.
*Assistant Examiner*—James M Mitchell
(74) *Attorney, Agent, or Firm*—Buchanan Ingersoll & Rooney PC

(57) ABSTRACT

To fabricate a semiconductor device, a pattern of recesses and lands is formed on a copper sheet as a matrix sheet, and BGA pads are formed on the lands on the copper sheet. An insulating layer is formed on the copper sheet to transfer the pattern of recesses and lands from the copper sheet to the insulating layer for thereby forming recesses in the insulating layer and placing BGA pads in the recesses in the insulating layer. Vias are formed through the insulating layer, and a conductive layer serving as circuits and interconnections is formed, the conductive layer being connected to the BGA pads by the vias. When the copper sheet is removed, the BGA pads are positioned within the recesses in the insulating layer. The BGA pads have surfaces positioned higher than the bottom of the recesses and lower than the surface of the insulating layer. A semiconductor chip is mounted on the conductive layer, and solder balls are joined to the BGA pads. Both the productivity of a process of mounting the solder balls and the bonding strength of the solder balls are increased.

2 Claims, 18 Drawing Sheets

U.S. PATENT DOCUMENTS

| | | | |
|---|---|---|---|
| 6,794,273 B2* | 9/2004 | Saito et al. | 438/462 |
| 6,815,827 B2* | 11/2004 | Vieux-Rochaz et al. | 257/775 |
| 6,838,368 B1* | 1/2005 | Ohsawa et al. | 438/614 |
| 6,884,652 B2* | 4/2005 | Huang et al. | 438/106 |
| 7,071,089 B1* | 7/2006 | Lin et al. | 438/612 |
| 7,091,820 B2* | 8/2006 | Fjelstad | 338/312 |
| 2001/0006119 A1* | 7/2001 | Sasaki et al. | 174/260 |
| 2002/0105092 A1* | 8/2002 | Coyle | 257/778 |
| 2003/0045024 A1* | 3/2003 | Shimoto et al. | 438/106 |
| 2003/0134450 A1* | 7/2003 | Lee | 438/106 |

FOREIGN PATENT DOCUMENTS

| | | |
|---|---|---|
| JP | 10-125819 A | 5/1998 |
| JP | 11-054896 A | 2/1999 |
| JP | 11-126797 A | 5/1999 |
| JP | 2000-031630 A | 1/2000 |
| JP | 2001-036238 A | 2/2001 |
| JP | 2001-044578 A | 2/2001 |
| JP | 2001-044583 A | 2/2001 |
| JP | 2001-044589 A | 2/2001 |
| JP | 2001-230339 A | 8/2001 |
| JP | 2001-230513 | 8/2001 |
| JP | 2001-230513 A | 8/2001 |

\* cited by examiner

BOARD FOR MOUNTING BGA SEMICONDUCTOR CHIP THEREON, SEMICONDUCTOR DEVICE, AND METHODS OF FABRICATING SUCH BOARD AND SEMICONDUCTOR DEVICE

BACKGROUND OF THE INVENTION

1. Field of the Invention

The present invention relates to a board for mounting a semiconductor chip thereon, a method of fabricating such a board, a semiconductor device, and a method of fabricating such a semiconductor device, and more particularly to a semiconductor device in a BGA (Ball Grid Array) type package, a multilayer wiring board for use in such a semiconductor device, and methods of fabricating such a semiconductor device and such a multilayer wiring board.

2. Description of the Related Art

Heretofore, boards for mounting semiconductor chips thereon to make up BGA-type semiconductor devices comprise a glass epoxy multilayer wiring board or a build-up multilayer wiring board which is produced by stacking conductive layers and insulating layers repeatedly on a support plate of metal and then removing the support plate.

The glass epoxy multilayer wiring board is made of an organic material having low heat resistance as a base material. Therefore, the glass epoxy multilayer wiring board is disadvantageous in that when heated, it is warped or distorted, presenting an obstacle to efforts to form fine interconnections in the fabrication of wiring boards and possibly reducing the reliability of connections over a long period of time after components have been mounted on the board. The build-up multilayer wiring board, which is designed to eliminate the above shortcomings, has a multilayer circuit constructed on one surface of a flat metal sheet according to a build-up process for eliminating possible causes of heat-induced warpages and distortions, thereby making it possible to produce fine interconnections in the fabrication process and to improve the reliability of connections over a long period of time.

A process of forming a BGA pad (electrode pad) on a metal sheet, thereafter producing a multilayer circuit according to a build-up process, and then removing the metal sheet is disclosed in Japanese laid-open patent publications Nos. 2001-36238, 2001-44578, 2001-44583, and 2001-44589. According to a BGA package fabrication process (see FIGS. 1A and 1B of the accompanying drawings) disclosed in the above publications, after BGA pads 31 are formed on a metal sheet (not shown), conductive layer 32 is formed on BGA pads 31, and then insulating layer 33 is formed on conductive layer 32 and metal sheet, after which via 34 is formed through insulating layer 33. Although not shown, a semiconductor chip such as an LSI chip or the like is mounted on via 34, after which the metal sheet is removed. Conductive layer 32 includes connection terminals 32a positioned directly above BGA pads 31 and having an area greater than BGA pads 31, and interconnections 32b extending from connection terminals 32a to via 34.

With the structure shown in FIGS. 1A and 1B, since conductive layer 32 is formed directly over BGA pads 31, interconnections 32b connected through via 32 to the semiconductor chip are located in limited positions so as not to be short-circuited to other BGA pads 31. Thus, the interconnections cannot be formed over many other BGA pads 31, and should be formed in those areas which are free of other BGA pads 31. The interconnections are also required to be kept out of contact with other connection terminals 32a. As a result, interconnections 32b individually connecting from a plurality of BGA pads 31 forming columns to the semiconductor chip cannot be packed in a high density. Specific examples of formed patterns of interconnections 32b which represent the numbers of columns of BGA pads 31 and corresponding interconnections 32b are shown in Table 1 below. BGA pads 31 have a diameter of 250 µm and are spaced by a pitch of 0.5 mm, and via 34 has a diameter of 75 µm.

TABLE 1

| Number of columns of BGA pads | Max. number of interconnections between pads | Width and spacing of interconnections |
| --- | --- | --- |
| 2 | 1 | 50 µm |
| 4 | 3 | 27 µm |
| 6 | 5 | 19 µm |
| 9 | 8 | 12 µm |

As shown in Table 1, as the number of columns of BGA pads 31 increases, the width and spacing of interconnections 32b decrease. Since the fabrication process suffers limitations that make it impossible to form interconnections 32 whose width and spacing are 20 µm or less, the number of actually available columns of BGA pads 31 is limited to five or less.

Multilayer interconnection boards for BGA packages are required to meet two requirements about the productivity of a solder ball mounting process and the bonding strength of solder balls. These two requirements will be described in detail below.

The productivity of a solder ball mounting process refers to the accuracy of a process of placing solder balls 35 (see FIGS. 2A through 2C of the accompanying drawings) on BGA pad 31. In this process, solder balls 35 are placed on BGA pad 31 coated with a flux or a solder paste and arrayed, after which solder balls 35 are joined to BGA pad 31 by reflow heating. When solder balls 35 are subjected to reflow heating, solder balls 35 may possibly move due to different flux quantities and different flux activity levels on BGA pad 31, resulting in soldering failures such that adjacent solder balls 35 may join each other and fall off BGA pad 31.

The bonding strength of solder balls refers to the reliability of connections over a long period of time after the semiconductor device in the BGA package is mounted on another board. The bonding between BGA pad 31 and solder balls 35 may possibly become unreliable owing to the difference between the coefficient of thermal expansion of the semiconductor device and the coefficient of thermal expansion of the board on which the semiconductor device is mounted. Particularly, BGA package semiconductor devices of more pins and greater outer profiles tend to have smaller solder bonding strength and suffer more solder joint cracking.

Generally, as shown in FIGS. 2A through 2C, the surface of BGA pad 31 on the multilayer wiring board may be positioned in three different ways with respect to the surface of insulating layer 33. These three different ways shown in FIGS. 2A through 2C provide respective different properties shown in Table 2.

TABLE 2

| Position of surface of BGA pad (FIGS.) | Productivity of solder ball mounting process | Bonding strength of solder balls |
|---|---|---|
| Lower than insulating layer surface (FIG. 2A) | ◯ | X |
| Lying flush with insulating layer surface (FIG. 2B) | X | X |
| Higher than insulating layer surface (FIG. 2C) | X | ◯ |

As shown in FIG. 2A, if the surface of BGA pad 31 is lower than the surface of insulating layer 33, then since solder ball 35 is held in position in a reflow process, the productivity of the solder ball mounting process is high and the yield is increased. However, solder ball 35 is joined to only the principal surface of BGA pad 31, the area of contact between BGA pad 31 and solder ball 35, i.e., the joining area therebetween, is small, and hence the bonding strength of solder ball 35 is small, tending to cause cracking in the joint. As shown in FIG. 2C, if the surface of BGA pad 31 is higher than the surface of insulating layer 33, then because solder ball 35 is joined to not only the principal surface of BGA pad 31, but also side surfaces thereof, the joining area between BGA pad 31 and solder ball 35 is large, and the bonding strength of solder ball 35 is large, making it difficult to cause cracking in the joint. However, since solder ball 35 is not held stably in position but is liable to move in the reflow process, the productivity of the solder ball mounting process is low. As shown in FIG. 2B, if the surface of BGA pad 31 lies flush with the surface of insulating layer 33, then the productivity of the solder ball mounting process is low and the bonding strength of solder ball 35 is small. With either one of the bonding patterns shown in FIGS. 2A through 2C, it is impossible to simultaneously meet the requirements about both the productivity of the solder ball mounting process and the bonding strength of solder ball 35.

According to the process of fabricating multilayer wiring boards, BGA pad 31 is formed on flat insulating layer 3. Therefore, solder resist 36 (see FIGS. 3A through 3B of the accompanying drawings) may be formed on insulating layer 33 to provide a desired surface configuration around BGA pad 31.

FIG. 3A shows a so-called over-resist structure in which the surface of solder resist 36 is higher than the surface of BGA pad 31. In the over-resist structure, BGA pad 31 has its outer periphery covered with solder resist 36. Until solder ball 35 is fixed after it is mounted in position in the reflow process, solder ball 35 is not displaced, and BGA pad 31 and insulating layer 33 lying therebeneath are held in intimate contact with each other. The productivity of the solder ball mounting process is good, but the bonding strength of solder ball 35 is poor. FIG. 3B shows a so-called non-over-resist structure (normal resist structure) in which solder resist 36 does not cover the surface of BGA pad 31. In the non-over-resist structure, the solder flows around the side surfaces of BGA pad 31 to join solder ball 35 as mentioned above. Though the bonding strength of solder ball 35 is high, the BGA pad 31 and insulating layer 33 are not held in intimate contact with each other, with the result that the productivity of the solder ball mounting process is poor.

Japanese laid-open patent publication No. 2001-230513 discloses a partial combination of the over-resist and non-over-resist structures in which solder resist 36 has an elliptical opening defined therein.

Japanese laid-open patent publication No. 2001-230339 reveals an over-resist structure in which a criss-cross recess is defined in BGA pad 31 for increasing the bonding strength according to the soldering process.

Japanese laid-open patent publication No. 11-54896 shows an over-resist structure in which only a portion of solder resist 36 which extends around BGA pad 31 is removed to the height of the surface of BGA pad 31 or lower by laser ablation, so that BGA pad 31 has a lower portion surrounded by solder resist 36 and an upper portion bonded to solder ball 35.

All the above disclosed structures are based on the arrangement that solder resist 36 is formed on insulating layer 33. The laminated assembly of such different materials suffers a strain caused by stresses. Specifically, since strains concentrate on the corners of the interface between layers 33, 36, the assembly tends to cause fractures such as cracking due to shocks imposed when the assembly falls by gravity and hits a hard object or thermal shocks. Even if solder resist 36 and insulating layer 33 lying therebeneath are of one organic material, they are liable to be broken apart because the organic material develop different mechanical properties depending on the thermal hysteresis. It is preferable that solder resist 36 and insulating layer 33 be not separate from each other, but formed of the same material according to the same process.

SUMMARY OF THE INVENTION

It is an object of the present invention to provide a board for mounting a semiconductor chip thereon and a semiconductor device, which can meet requirements about the productivity of a solder ball mounting process and the bonding strength of solder balls, can easily be fabricated, have a small tendency to break, and allow a number of BGA pads to be arranged in a high density, and methods of fabricating such a board for mounting a semiconductor chip thereon and such a semiconductor device.

A board for mounting a semiconductor chip thereon according to the present invention has an insulating layer, an electrode pad mounted on one surface of the insulating layer, a conductive layer mounted on an opposite surface of the insulating layer, and a via extending through the insulating layer and connecting the electrode pad and the conductive layer to each other. The electrode pad is disposed in a recess defined in the insulating layer, and has a surface positioned higher than the bottom of the recess and lower than the surface of the insulating layer.

With the above arrangement, when a solder ball is placed on the electrode pad, since the solder ball is stably held in the recess in the insulating layer, the productivity of a process of mounting the solder ball is high. Furthermore, because the solder ball is joined to cover the upper surface and side surfaces of the electrode pad, the bonding strength of the solder ball is high, and particularly, resistance against lateral stress is high. The board according to the present invention can be fabricated with ease at a low cost, and is less liable to be broken by strains due to stresses. Since the conductive layer is formed over the electrode pad with the insulating layer interposed therebetween, interconnections provided by the conductive layers may be positioned with greater freedom, and many interconnections may be provided on the board, allowing a plurality of electrode pads to be packed in a high density.

The recess in the insulating layer should preferably be formed by transferring a pattern of recesses and lands from a matrix sheet to the insulating layer. The matrix sheet should preferably be a metal sheet.

The electrode pad is highly stable in position if it is partly embedded in the insulating layer.

A semiconductor device according to the present invention has a board for mounting a semiconductor chip thereon as described above, a semiconductor chip connected to the conductive layer, and a solder ball joined to the electrode pad. The solder ball is placed in the recess in the insulating layer.

A method of fabricating a board for mounting a semiconductor chip thereon according to the present invention comprises the steps of forming a pattern of recesses and lands on a surface of a matrix sheet, forming an electrode pad on the surface of the matrix sheet, forming an insulating layer in covering relation to the surface of the matrix sheet, forming a via through the insulating layer, forming a conductive layer on a surface of the insulating layer remote from the matrix sheet, the conductive layer being connected to the electrode pad through the via, and removing the matrix sheet. The pattern of recesses and lands is transferred from the matrix sheet to a surface of the insulating layer for thereby forming a recess in the insulating layer and placing the electrode pad in the recess, the electrode pad having a surface positioned higher than the bottom of the recess and lower than the surface of the insulating layer;

The above method uses the matrix sheet as a reversal pattern of the insulating layer for easily forming the insulating layer of a complex shape including the recess.

When the electrode pad is formed, it should preferably be formed on a land of the matrix sheet, and placed in the recess in the insulating layer upon transfer of the pattern of recesses and lands from the matrix sheet to the insulating layer.

The matrix sheet should preferably be a metal sheet.

When the electrode pad is placed in the recess in the insulating layer, the electrode pad should preferably be embedded partly in the insulating layer.

A method of fabricating a semiconductor device according to the present invention comprises the steps of the method of fabricating a semiconductor chip thereon as described above, mounting a semiconductor chip on the conductive layer, and joining a solder ball to the electrode pad after the matrix sheet is removed. Preferably, the solder ball is placed in the recess in the insulating layer.

The above and other objects, features, and advantages of the present invention will become apparent from the following description with reference to the accompanying drawings which illustrate examples of the present invention.

DESCRIPTION OF THE PREFERRED EMBODIMENTS

Figure 4:
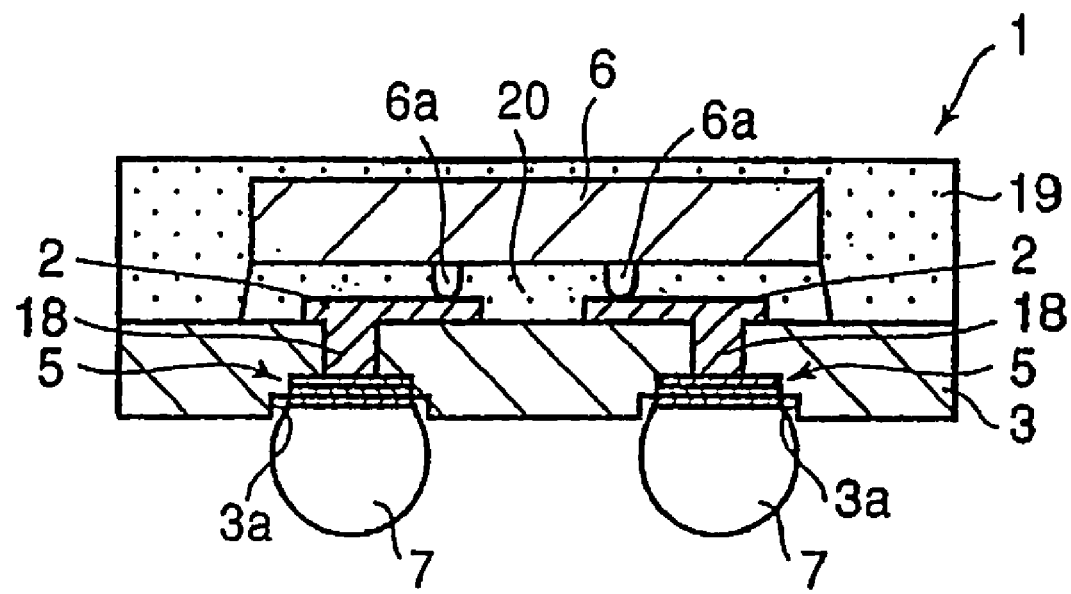
FIG. 4 is a cross-sectional view of a semiconductor device according to the present invention.
Figure 5:
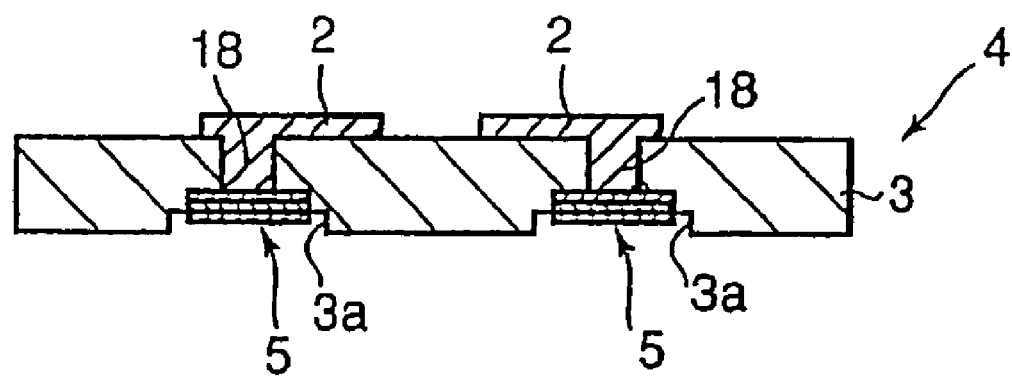
FIG. 5 is a cross-sectional view of a board for mounting a semiconductor chip thereon according to the present invention.
Figure 6A:
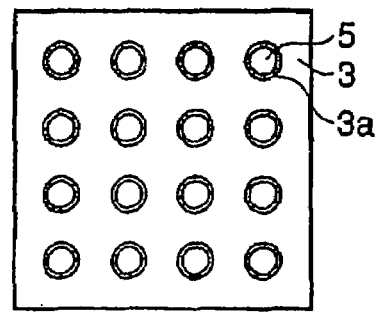
FIG. 6A is a plan view of a BGA pad forming surface of the board shown in FIG. 5.
Figure 6B:
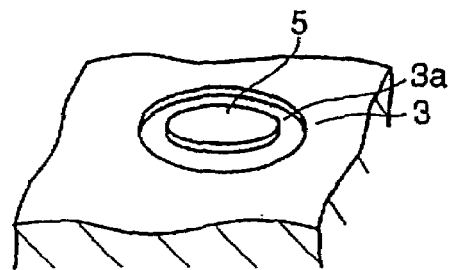
FIG. 6B is an enlarged fragmentary perspective view of the BGA pad forming surface shown in FIG. 6A.
Figure 6C:
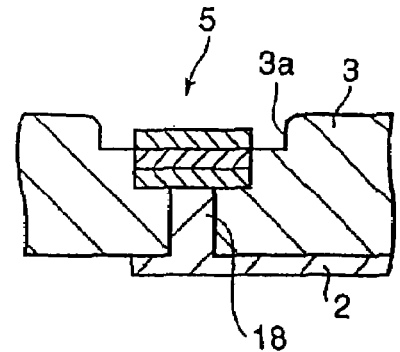
FIG. 6C is an enlarged fragmentary cross-sectional view of the BGA pad forming surface shown in FIG. 6A.
Figure 6D:
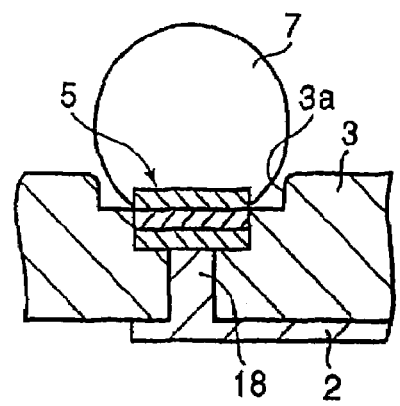
FIG. 6D is an enlarged fragmentary cross-sectional view of the BGA pad forming surface with a solder ball mounted thereon shown in FIG. 6A.
Figure 7:
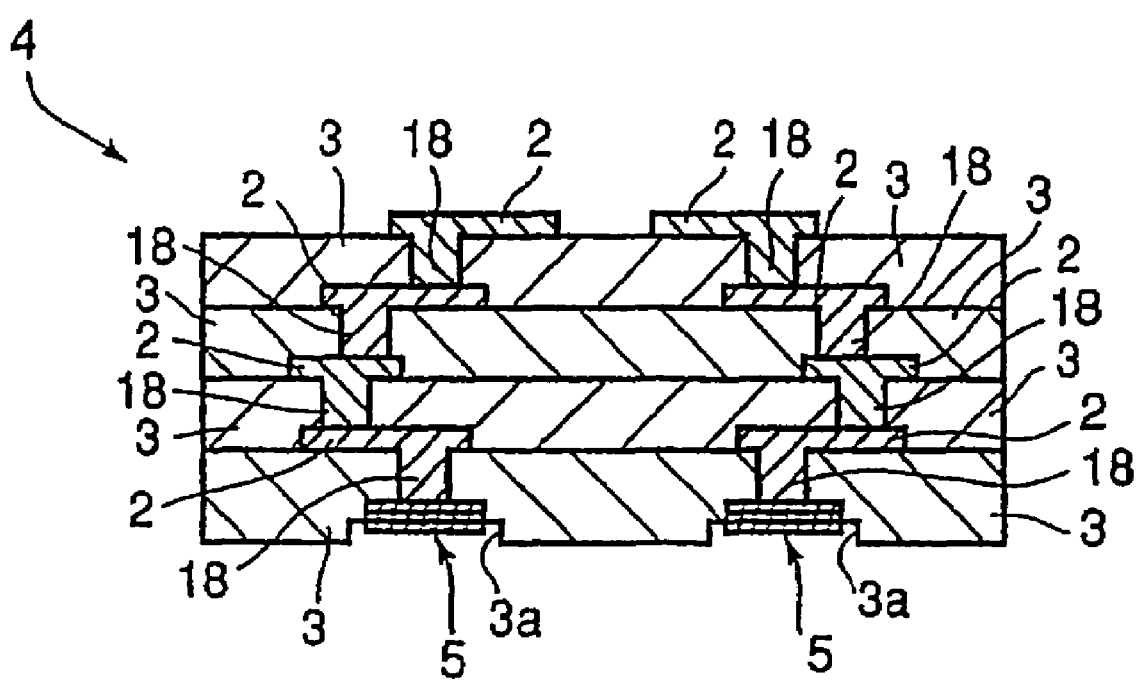
FIG. 7 is a cross-sectional view of a multilayer board for mounting a semiconductor chip thereon according to the present invention.

FIG. 4 shows in cross section semiconductor device 1 according to the present invention, and FIG. 5 shows in cross section board 4 for mounting a semiconductor chip thereon according to the present invention.

As shown in FIG. 5, board 4 for mounting a semiconductor chip thereon according to the present invention has a multilayer wiring board comprising a laminated assembly of conductive layer (circuit layer) 2 and insulating layer (interlayer insulating layer) 3, and a plurality of BGA pads (electrode pads) 5 formed on the multilayer wiring board. BGA pads 5 are formed on only one surface of insulating layer 3, and conductive layer 2 and BGA pads 5 are connected to each other by vias 18 extending through insulating layer 3. Insulating layer 3 has recesses 3a defined therein for accommodating BGA pads 5 therein. BGA pads 5 placed in respective recesses 3a project from the bottom of recesses 3a, and have base portions embedded in insulating layer 3. As shown in FIGS. 6A through 6D in which BGA pads 5 are shown as facing upwardly, BGA pad 5 has an upper surface positioned lower than the upper surface of insulating layer 3 and higher than the bottom of recess 3a which surrounds BGA pad 5. A gap is present between the outer peripheral edge of BGA pad 5 and the inner peripheral edge of recess 3a.

As shown in FIG. 4, semiconductor chip 6 is mounted on the surface of board 4 which is opposite to the surface thereof on which BGA pads 5 are formed. Solder balls 7 are joined to respective BGA pads 5. Semiconductor device 1 for being mounted on another board is thus completed. As shown in FIG. 4, semiconductor chip 6 is connected to BGA pads 5 by bumps 6a, and is sealed by underfilled resin 20 and molded resin 19. Although not described in detail, conductive layers 2 have various circuits and interconnections disposed therein.

To fabricate semiconductor device 1, metal sheet 8 (see FIGS. 10A through 13D) having a reverse pattern of recesses and lands is used as a matrix sheet. For example, etching resist 9 (see FIGS. 10B through 10D) for forming a mold for insulating layer 3 is formed on copper sheet 8 by photolithography. After copper sheet 8 is etched, etching resist 9 is removed. Plating resist 12 (see FIGS. 12A through 12D) for forming a pattern of BGA pads 5 is formed on copper sheet 8 by photolithography, and copper sheet 8 is etched to form a pattern of recesses and lands which are a reversal of insulating layer 3, on copper sheet 8. Then, gold, nickel, and copper are electroplated, in the order named, to form BGA pads 5 on copper sheet 8, after which plating resist 12 is removed. An insulating resin is thermally pressed against copper sheet 8 by a vacuum laminator or heated and pressed by a laminating press machine, thus forming insulating layer 3 which is cured. At this time, copper sheet 8 is used as a mold to transfer the pattern of recesses and lands to insulating layer 3. Via holes 17 (see FIG. 13B) for connecting between layers are formed in insulating layer 3 by a laser beam. After copper is plated in via holes 17 and on the surface of insulating layer 3, the insulating layer 3 is etched to form vias 18 and conductive layers (circuits and interconnections) 2. Semiconductor chip 6 is mounted in connection to conductive layers 2, after which copper sheet 8 is chemically etched away to expose BGA pads 5. Then, solder balls 7 are mounted, providing a BGA package. Actually, as shown in 7, board 4 for mounting a semiconductor chip thereon is often constructed as a multilayer wiring board comprising an alternate assembly of insulating layers 3 and conductive layers 2. However, board 4 mounting a semiconductor chip thereon is shown and described herein as having single insulating layer 3 and single conductive layer 2 for the sake of brevity.

With board 4 mounting a semiconductor chip thereon and semiconductor device 1, as shown in FIGS. 4 through 6D, BGA pad 5 is formed inside recess 3a in insulating layer 3. When BGA pad 5 is shown as facing upwardly, the upper surface of BGA pad 5 projects upwardly from the bottom of recess 3a in insulating layer 3 and is positioned lower than the upper surface of insulating layer 3. BGA pad 5 has a lower portion embedded in insulating layer 3. With this arrangement, during a process of mounting solder ball 7 on BGA pad 5, solder ball 7 is stably held in recess 3a that is positioned around BGA pad 5. Therefore, when the assembly is heated for a reflow process, solder ball 7 is prevented from moving. As a result, a soldering failure is less likely to happen, and the productivity of a process of mounting solder ball 7 is increased.

As shown in FIGS. 6A through 6D, since the upper surface of BGA pad 5 is higher than the bottom of recess 3a in insulating layer 3, when solder ball 7 is joined, it can be soldered in covering relation to not only the upper surface of BGA pad 5 but also a portion of the side surfaces thereof. Therefore, the bonding strength between solder ball 7 and BGA pad 5 is high, and they are connected to each other highly reliably.

According to the above fabrication process, insulating layer 3 is formed on metal sheet 8 which is used as a matrix sheet having a reverse pattern of recesses and lands. Therefore, a pattern of recesses and lands transferred from metal sheet 8 is formed on the surface of insulating layer 3 on which BGA pads 5 are to be formed. Therefore, the board 4 for mounting a semiconductor chip thereon can easily be fabricated while meeting requirements about both the productivity of the process of mounting solder balls 7 and the bonding strength of BGA pads 5.

Figure 1A:
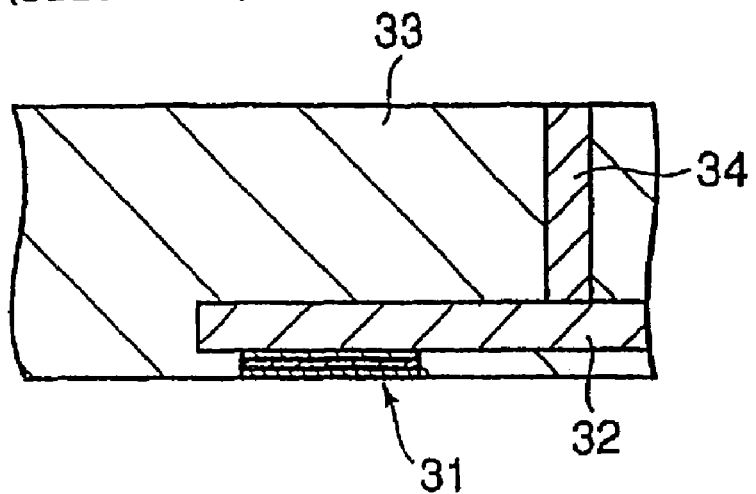
FIG. 1A is an enlarged fragmentary cross-sectional view showing interconnections of a circuit layer on a conventional board for mounting a semiconductor chip thereon.
Figure 1B:
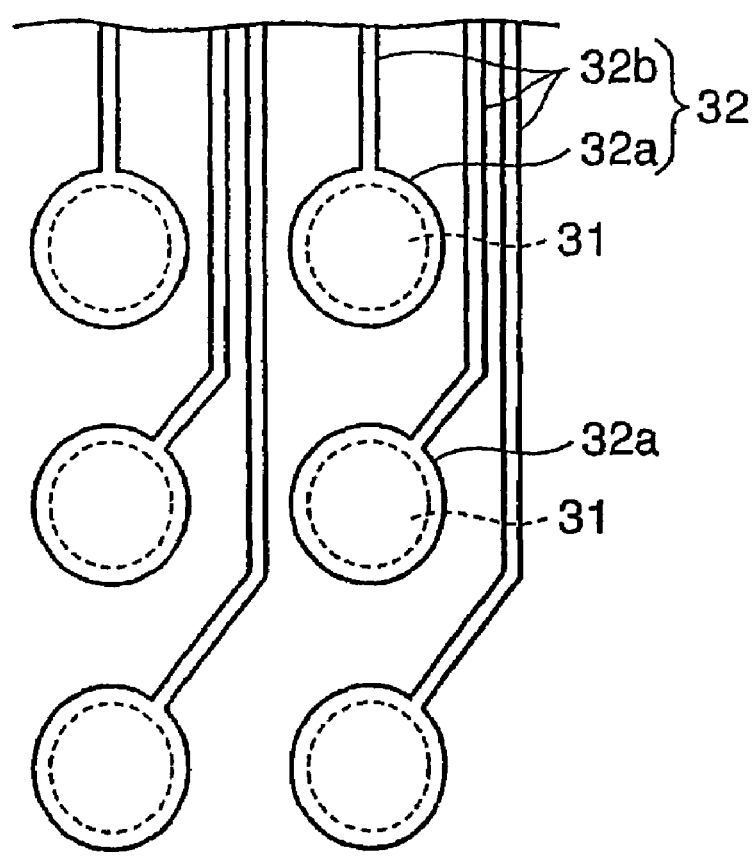
FIG. 1B is an enlarged plan view of the interconnections shown in FIG. 1A.
Figure 2A:
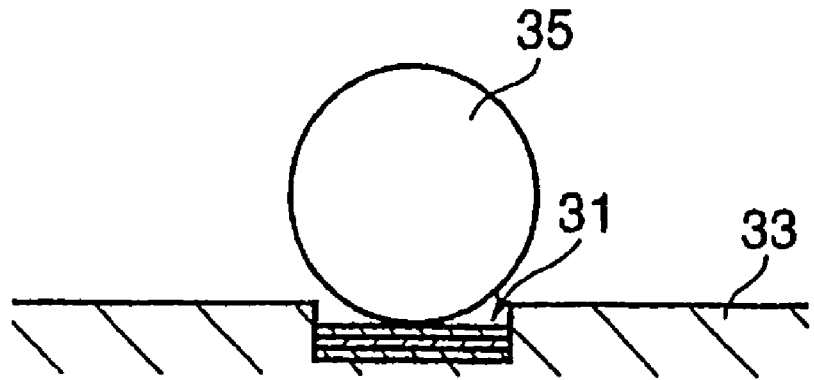
FIGS. 2A through 2C are enlarged fragmentary cross-sectional views each showing the relationship between a semiconductor chip, an insulating layer, and a solder ball in a conventional semiconductor device.
Figure 2B:
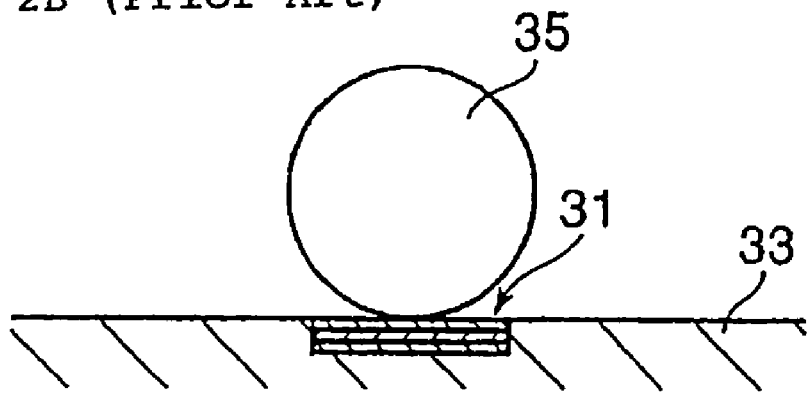
Figure 2C:
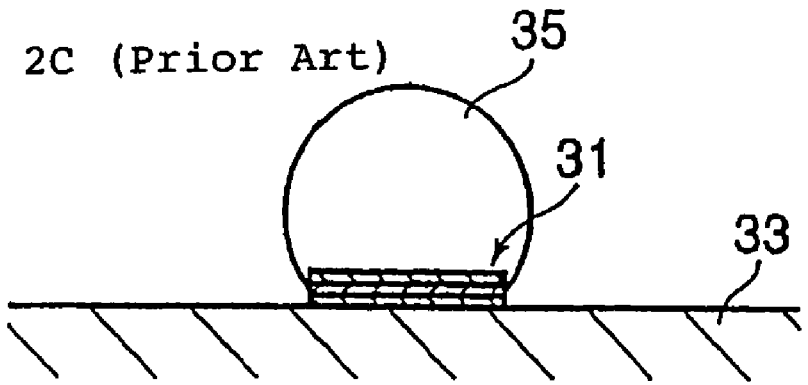
Figure 3A:
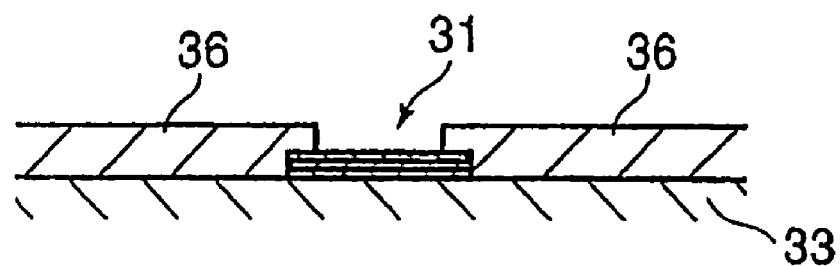
FIG. 3A is an enlarged fragmentary cross-sectional view showing an over-resist structure of a conventional semiconductor device.
Figure 3B:
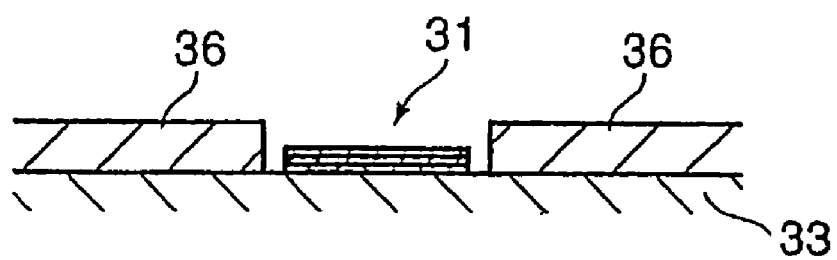
FIG. 3B is an enlarged fragmentary cross-sectional view showing a non-over-resist structure of a conventional semiconductor device.

In the conventional structure shown in FIGS. 1A and 1B, since conductive layer 32 is formed directly over BGA pads 31, interconnections 32b suffer large positional limitations and cannot be packed in a high density. In order to fabricate interconnections 32b in the examples shown in Table 1, the number of actually available columns of BGA pads 31 has been limited to five or less.

Figure 8A:
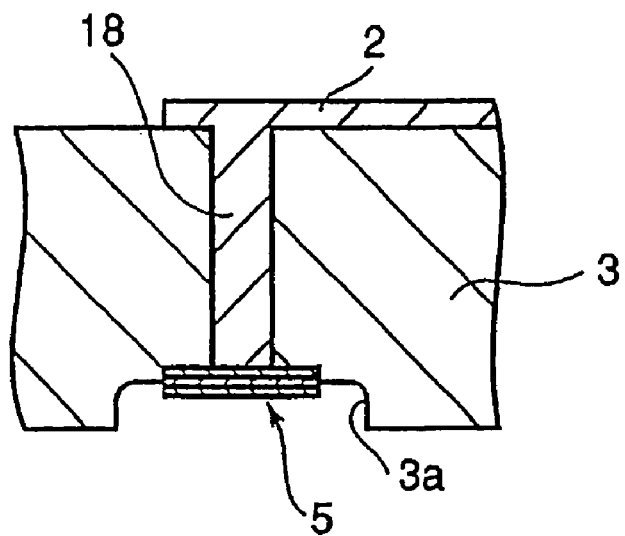
FIG. 8A is an enlarged fragmentary cross-sectional view of a board for mounting a semiconductor chip thereon according to the present invention.
Figure 8B:
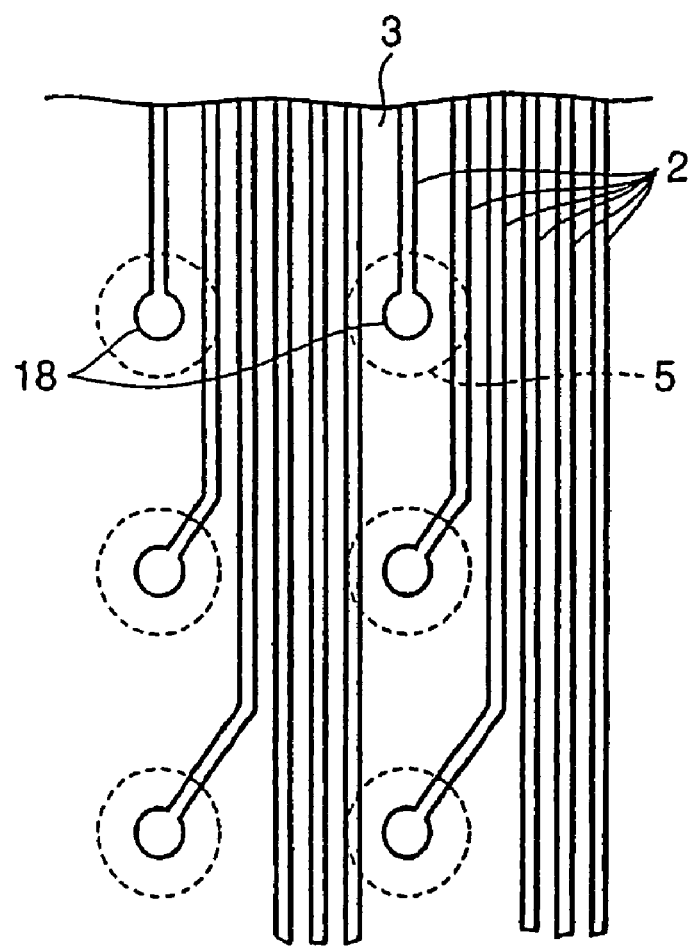
FIG. 8B is an enlarged plan view showing interconnections of a circuit layer on the board shown in FIG. 8A.

According to the present invention, as shown in FIGS. 8A and 8B, conductive layers 2 are formed over BGA pads 5 with insulating layer 3 interposed therebetween, and insulating layer 3 and conductive layers 2 are connected to each other by vias 18. Accordingly, conductive layers 2 extending from a number of BGA pads 5 to semiconductor chip 6 can be formed in a wide area except for small-diameter vias 18. While a number of interconnections 32b have to be placed in a small area except large-diameter connection terminals 32a and BGA pads 31 in the conventional arrangement shown in FIGS. 1A and 1B, the interconnections can be placed in a much wider area according to the present invention, as shown in FIGS. 8A and 8B. According to the present invention, therefore, the board 4 has an excellent ability to accommodate interconnections, and allows much more BGA pads 5 to be formed in a higher density than the conventional arrangement.

Specific examples of formed patterns of interconnections which represent the numbers of columns of BGA pads 5 and corresponding interconnections are shown in Table 3 below. As with the conventional details (Table 1), BGA pads 5 have a diameter of 250 μm and are spaced by a pitch of 0.5 mm, but vias 18 have a diameter of 150 μm.

TABLE 3

| Number of columns of BGA pads | Max. number of interconnections between pads | Width and spacing of interconnections |
|---|---|---|
| 2 | 1 | 117 μm |
| 4 | 3 | 50 μm |
| 6 | 5 | 32 μm |
| 9 | 8 | 20 μm |

As shown in Table 3, as the number of columns of BGA pads 5 increases, the width and spacing of interconnections decrease. However, even if the number of columns of BGA pads 5 is 9, the width and spacing of interconnections are 20 μm, so that they can be formed by a conventional process. Further, when the numbers of columns of BGA pads and interconnections are the same as those of prior art, the width and spacing of interconnections can be formed wider, so that the yield is improved.

Methods of fabricating semiconductor device 1 according to the present invention will be described below in specific details.

1st Embodiment

A method of fabricating semiconductor device 1 shown in FIGS. 4 and 6A through 6D according to a first embodiment of the present invention will be described below with reference to FIGS. 9 and 10A through 13E.

Metal sheet 8 (see FIG. 8) for use as a matrix sheet for insulating layer 3 is prepared. For example, a metal sheet KFC (trade name, thickness 0.25 mm) manufactured by Kobe Steel, which is a copper sheet according to U.S. CDA standard C19210, is prepared. Metal sheet 8 is not limited to the material and thickness described above. Metal sheet 8 may be any metal sheet insofar as it is a good electric conductor for use as a cathode in a subsequent plating process, can be chemically dissolvable by an etchant, and can serve as a support plate for stacking insulating layer 3 and conductive layer 2 thereon. Metal sheet 8 may be a steel sheet, a nickel sheet, a stainless steel sheet, a sheet of an alloy of these metals, or a sheet plated with these metals, other than a copper sheet. The thickness of metal sheet 8 may be selected in a range from 0.05 to 1.0 mm depending on the size of a semiconductor device to be fabricated.

Figure 9:
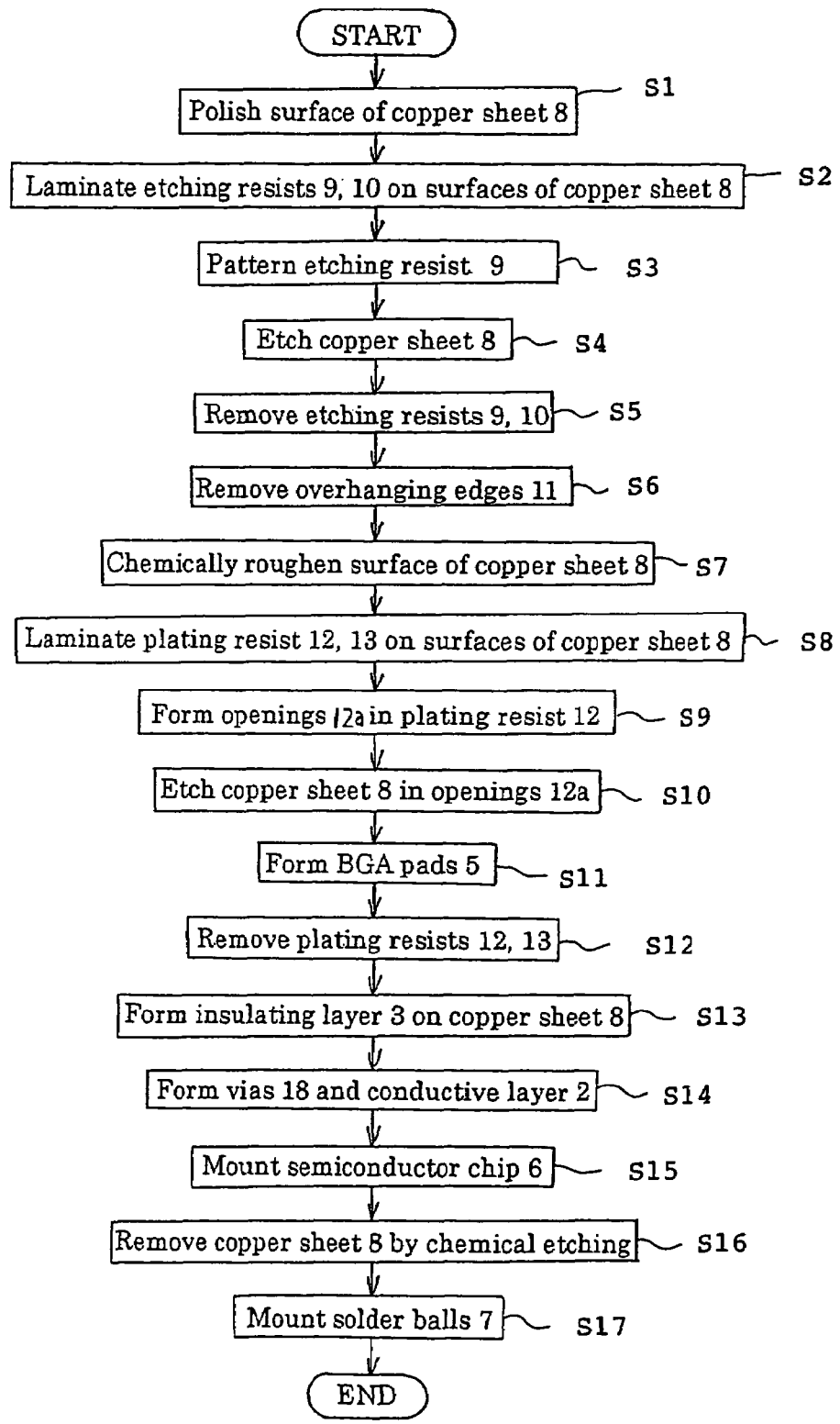
FIG. 9 is a flowchart of a method of fabricating a semiconductor device according to a first embodiment of the present invention.

The surface of copper sheet 8 is polished by a buff roll in step S1 (see FIG. 9). The surface of copper sheet 8 is polished for removing dirt from the surface of copper sheet 8 thereby to cleanse the same and also for increasing the intimate adhesion of photosensitive etching resists 9, 10 to prevent an etchant from seeping in. The surface of copper sheet 8 may be polished by a brush or a chemical polishing process such as soft etching, instead of a buff roll.

Figure 10A:
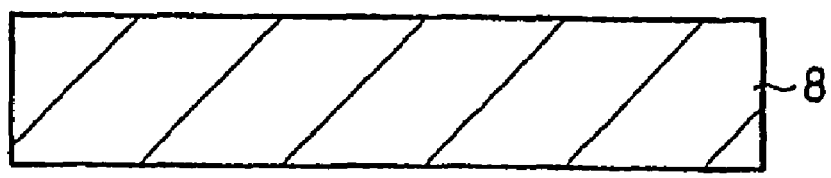
FIGS. 10A through 10E are cross-sectional views illustrative of former steps of methods of fabricating a semiconductor device according to first through third embodiments of the present invention.
Figure 10B:
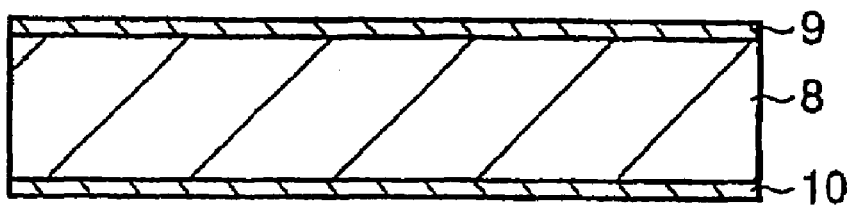

Then, as shown in FIG. 10B, etching resists 9, 10 are laminated on respective opposite surfaces of copper sheet 8 in step S2. Etching resists 9, 10 may be Liston FX125 (trade name, thickness 25 μm) manufactured by DuPont MRC Dry Film or Photech H—N150 (trade name, thickness 50 μm) manufactured by Hitachi Chemical, which is an alkali-developed photosensitive etching resist. The thickness of etching resists 9, 10 should be in the range from 15 to 50 μm. Thinner etching resists 9, 10 provide a better imaging accuracy, and thicker etching resists 9, 10 are less susceptible to damage and foreign object and can be handled with greater ease.

Figure 10C:
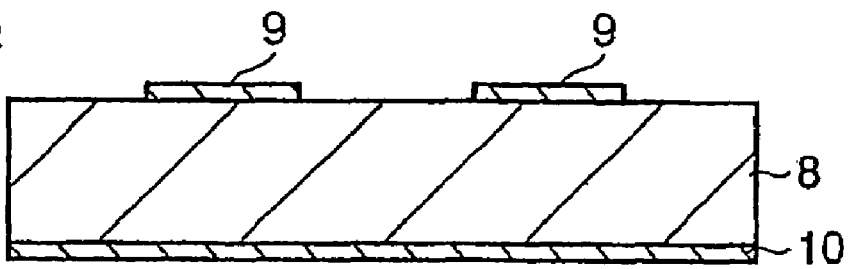

A mask film (not shown) having a pattern of circular openings aligned with the positions of BGA pads 5 to be formed subsequently is held against etching resist 9 on one surface of copper sheet 8, and no mask film is held against etching resist 10 on the other surface of copper sheet 8. Then, etching resists 9, 10 are exposed to an ultraviolet radiation. Then, etching resists 9, 10 are processed in a development process by an aqueous solution of sodium carbonate, eluting unexposed areas thereby to pattern etching resist 9 in step S3. As shown in FIG. 10C, only the areas on one surface of copper sheet 8 which are aligned with the positions of BGA pads 5 to be formed subsequently are covered with etching resist 9, whereas the entire other surface of copper sheet 8 is covered with etching resist 10. The size of the remaining areas of etching resist 9 depends on the pitch and diameter of BGA pads 5. Examples of preferable combinations of pitches and diameters are shown in Table 4 below.

TABLE 4

| Pitch of BGA pads | 0.5 μm | 0.4 μm | 0.3 μm |
|---|---|---|---|
| Diameter of BGA pads | 0.25 μm | 0.2 μm | 0.15 μm |
| Diameter of remaining areas of etching resist | 0.3 μm | 0.24 μm | 0.18 μm |
| Diameter of openings | 0.25 μm | 0.2 μm | 0.15 μm |
| Diameter of solder balls | 0.3 μm | 0.24 μm | 0.18 μm |

Then, an etchant comprising ferric chloride and hydrochloric acid is sprayed while being swung over copper sheet 8 to etch the areas of copper sheet 8 which are not covered with etching resist 9, to a uniform depth in step S4. Usually, those areas of copper sheet 8 are etched to a depth ranging from 10 to 30 μm. The etching depth may be changed by changing the etching time depending on the pitch and diameter of BGA pads 5 in semiconductor device 1 which will finally be completed. The etchant may be an aqueous solution of cupric chloride and hydrochloric acid which are mixed together, an aqueous solution of persulfates, an aqueous solution of sulfuric acid and hydrogen peroxide, or an alkaline aqueous solution of cuprammonium complex ions.

Figure 10D:
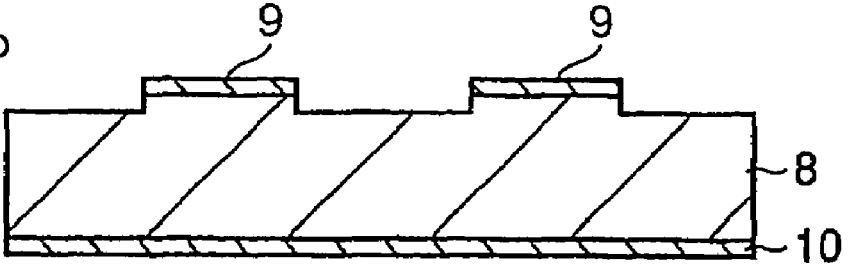
Figure 10E:
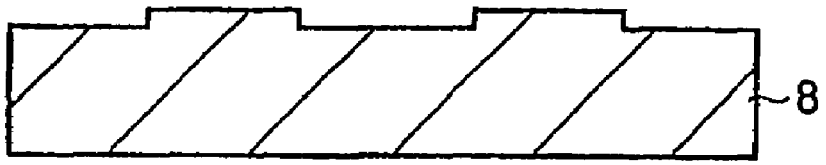

As shown in FIG. 10E, photosensitive etching resists 9, 10 are removed from copper sheet 8 by an aqueous solution of sodium hydroxide in step S5.

Figure 11A:
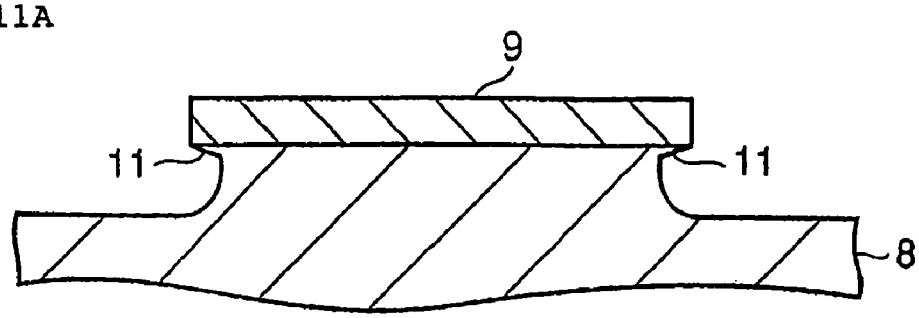
FIGS. 11A through 11C are cross-sectional views illustrative of an overhanging edge removal process of the methods of fabricating a semiconductor device according to the first through third embodiments of the present invention.
Figure 11B:
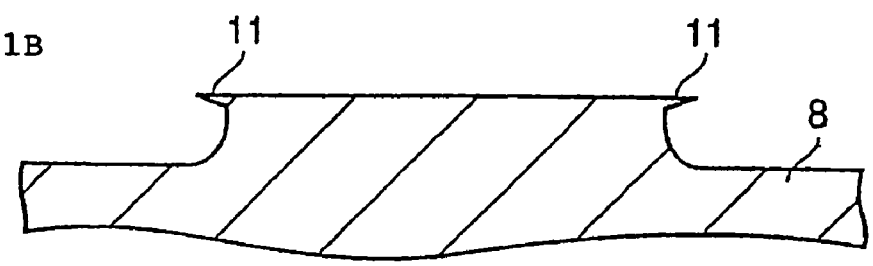

Then, an etchant comprising ferric chloride and hydrochloric acid is sprayed while being swung over copper sheet 8 to etch again the entire surface of copper sheet 8 to a depth ranging from 0.1 to 5 μm, thereby removing overhanging edges 11 produced on copper sheet 8 at the ends of the resist by etching, and eliminating sharp corners on the surface of copper sheet 8 in step S6. Specifically, when copper sheet 8 is etched in step S4, portions of copper sheet 8 covered with etching resist 9 are slightly removed by the etchant, as shown in FIG. 11A. However, portions of copper sheet 8 which are held in intimate contact with etching resist 9 remain unremoved as overhanging edges 11. When etching resist 9 is removed in step S5, overhanging edges 11 remain as sharp corners as shown in FIG. 11B. If insulating layer 3 were formed using such copper sheet 8 as a matrix sheet, then the sharp corners would be transferred to insulating layer 3. To remove the sharp corners, as shown in FIG. 1C, copper sheet 8 is etched again to remove overhanging edges 11 to eliminate sharp corners from the surface of copper sheet 8. In this manner, sharp corners will not be transferred to insulating layer 3 in a subsequent process. As shown in FIG. 1C, it is preferable to etch copper sheet 8 such that the corners on the surface of copper sheet 8 which are left after removal of overhanging edges 11 will be rounded to a radius of curvature ranging from 1 to 5 μm.

Then, a copper roughening liquid comprising sulfuric acid, hydrogen peroxide, and alkylimidazole is applied to etch the surface of copper sheet 8 to a depth ranging from 1 to 2 μm, thus chemically roughening copper sheet 8 in step S7. Copper sheet 8 is thus chemically roughened for increasing the intimate adhesion of plating-resist photosensitive films 12, 13 to be formed in a next process thereby to present a plating liquid from seeping in.

Figure 12A:
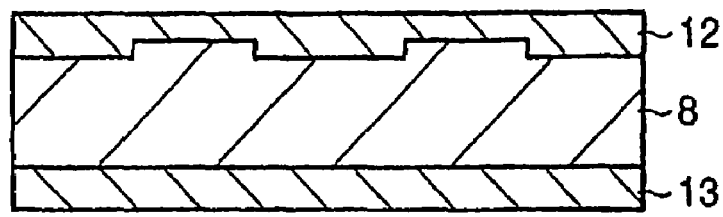
FIGS. 12A through 12E are cross-sectional views illustrative of middle steps of the method of fabricating a semiconductor device according to the first embodiment of the present invention.
Figure 12B:
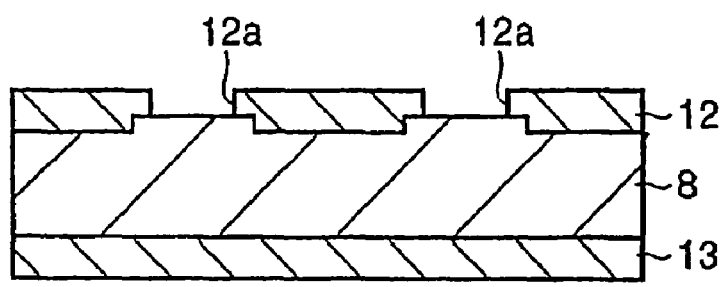
Figure 12C:
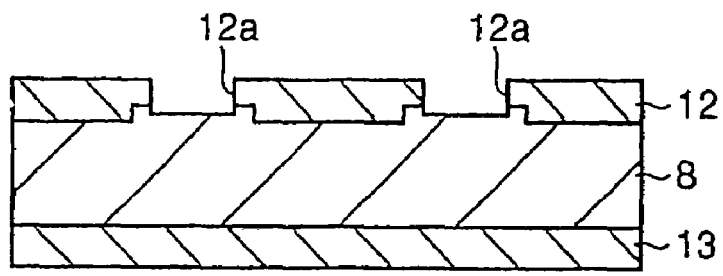

Then, as shown in FIG. 12A, plating-resist photosensitive films 12, 13 are laminated on respective opposite surfaces of copper sheet 8 in step S8. Photosensitive films 12, 13 may be Photech H-N640 (trade name, thickness 40 μm) manufactured by Hitachi Chemical. A mask film (not shown) having a pattern of circular openings aligned with the positions of BGA pads 5 to be formed subsequently is held against photosensitive film 12 on one surface of copper sheet 8, and no mask film is held against photosensitive film 13 on the other surface of copper sheet 8. Then, photosensitive films 12, 13 are exposed to an ultraviolet radiation. Then, photosensitive films 12, 13 are processed in a development process by an aqueous solution of sodium carbonate, eluting unexposed areas of photosensitive film 12 thereby to pattern photosensitive film 12 to form openings 12a in step S9. As shown in FIG. 12B, plating resist (photosensitive film 12) having openings 12a aligned with the positions of BGA pads 5 to be formed subsequently is formed on one surface of copper sheet 8, whereas the entire other surface of copper sheet 8 is covered with plating resist 13. The size of the openings 12a depends on the pitch and diameter of BGA pads 5. Examples of preferable combinations of pitches and diameters are shown in Table 4 above.

Then, an etchant comprising ferric chloride and hydrochloric acid is sprayed while being swung over copper sheet 8 to etch the areas of copper sheet 8 which are exposed in openings 12a, to a uniform depth in step S10. Usually, those areas of copper sheet 8 are etched to a depth ranging from 5 to 15 μm. The etching depth may be changed by changing the etching time depending on the pitch and diameter of BGA pads 5 in semiconductor device 1 which will finally be completed.

Figure 12D:
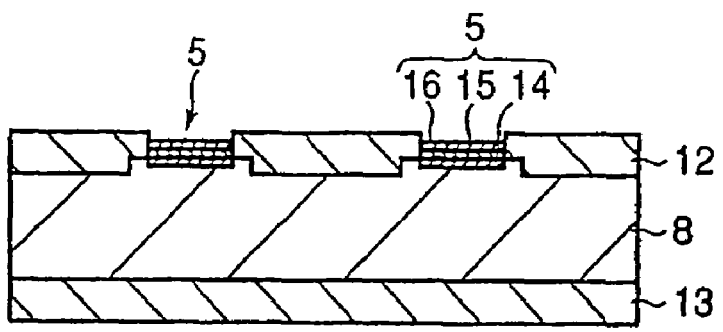

Then, an electroplating process is carried out using copper sheet 8 as a cathode. First, copper sheet 8 is degreased, subjected to gold strike plating, and then eletroplated in a pure gold plating bath to form gold plated layer 14 having a thickness ranging from 1 to 2 μm. Then, copper sheet 8 is electroplated in a nickel sulfamate bath to form nickel plated layer 15 having a thickness ranging from 2 to 5 μm. Finally, copper sheet 8 is electroplated in a copper sulfate bath to deposit copper plated layer 16 having a thickness ranging from 10 to 25 μm, thus forming BGA pads 5 as shown in FIG. 12D in step S11.

Figure 12E:
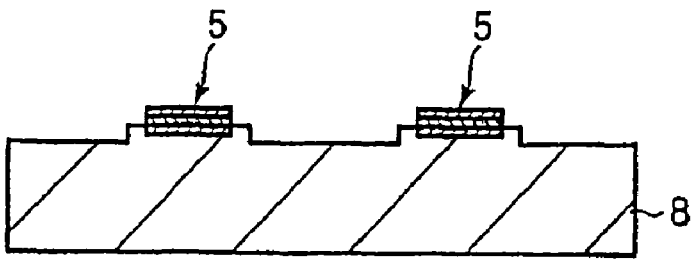

Then, plating resists (photosensitive films) 12, 13 are removed from copper sheet 8 by an aqueous solution of sodium hydroxide in step S12, as shown in FIG. 12E.

Figure 13A:
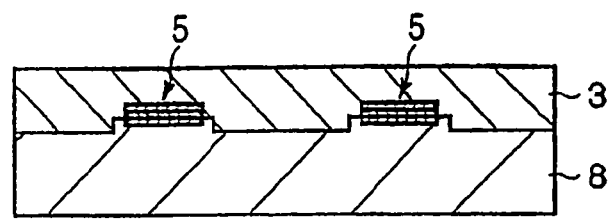
FIGS. 13A through 13E are cross-sectional views illustrative of latter steps of the method of fabricating a semiconductor device according to the first embodiment of the present invention.

Then, a previously prepared resin sheet with a copper foil, which has an insulating resin layer having a thickness ranging from 35 to 80 μm and coated with an epoxy resin which is then partly cured, is placed on copper sheet 8 and laminated by a vacuum hydraulic press. The copper foil is then removed by a known copper etching process, forming insulating layer 3 in step S13, as shown in FIG. 13A. Insulating layer 3 is not limited to a layer produced from a resin sheet with a copper foil. Instead of a resin sheet with a copper foil, a prepare and a copper foil may be subjected to laminating press process, and then the copper foil may be etched. Alternatively, an insulating resin sheet may be laminated in a vacuum and then hot cured into an insulating layer.

Figure 13B:
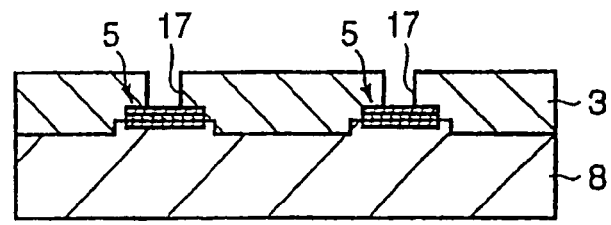
Figure 13C:
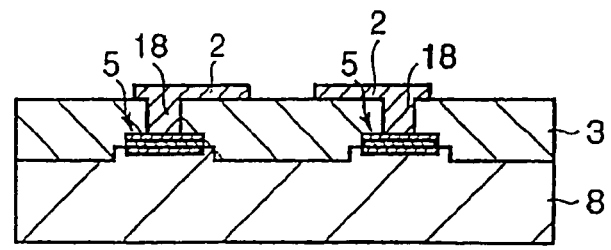

Then, the assembly is irradiated with a carbon gas laser beam or an UV-YAG laser beam to form via holes 17 in insulating layer 3, as shown in FIG. 13B. Since epoxy resin scum produced by the laser beam is deposited on the bottom of via holes 17, such epoxy resin scum is then removed by a desmearing process. Using copper sheet 8 as a cathode, an electric copper plating process is carried out to form a plated layer, which is patterned according to a known semiadditive process, thus producing vias 18 embedded in via holes 17 and conductive layer 2 serving as circuits in step S14, as shown in FIG. 13C. Alternatively, after an electric copper plating process is carried out using copper sheet 8 as a cathode, a pattern may be formed according to a known subtractive process.

Although not shown in detail, steps S13, S14 may be repeated to form a multilayer wiring board comprising a plurality of alternately arranged insulating layers 3 and conductive layers 2.

Figure 13D:
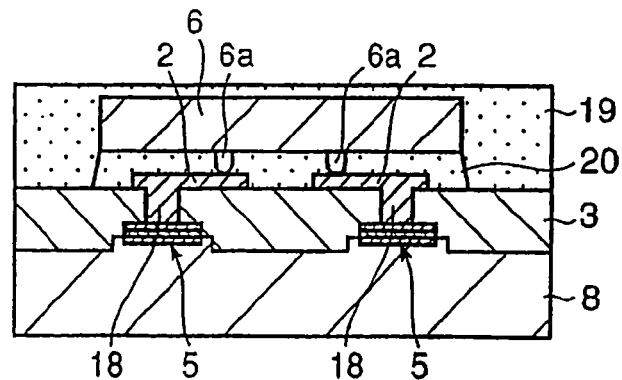

Then, as shown in FIG. 13D, semiconductor chip 6 connected to conductive layer 2 is mounted in place in step S15. Specifically, while bumps 6a of semiconductor chip 6 are being connected to conductive layer 2, underfilled resin 20 and molded resin 19 are poured and cured to seal semiconductor chip 6.

Figure 13E:
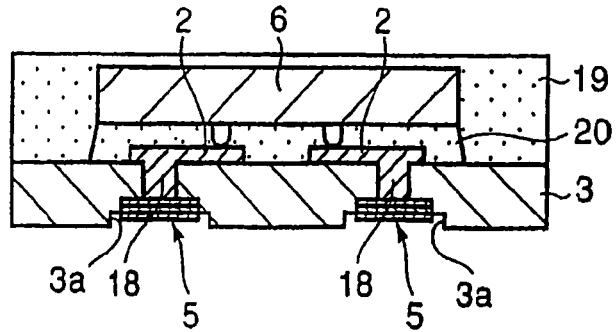
Figure 14:
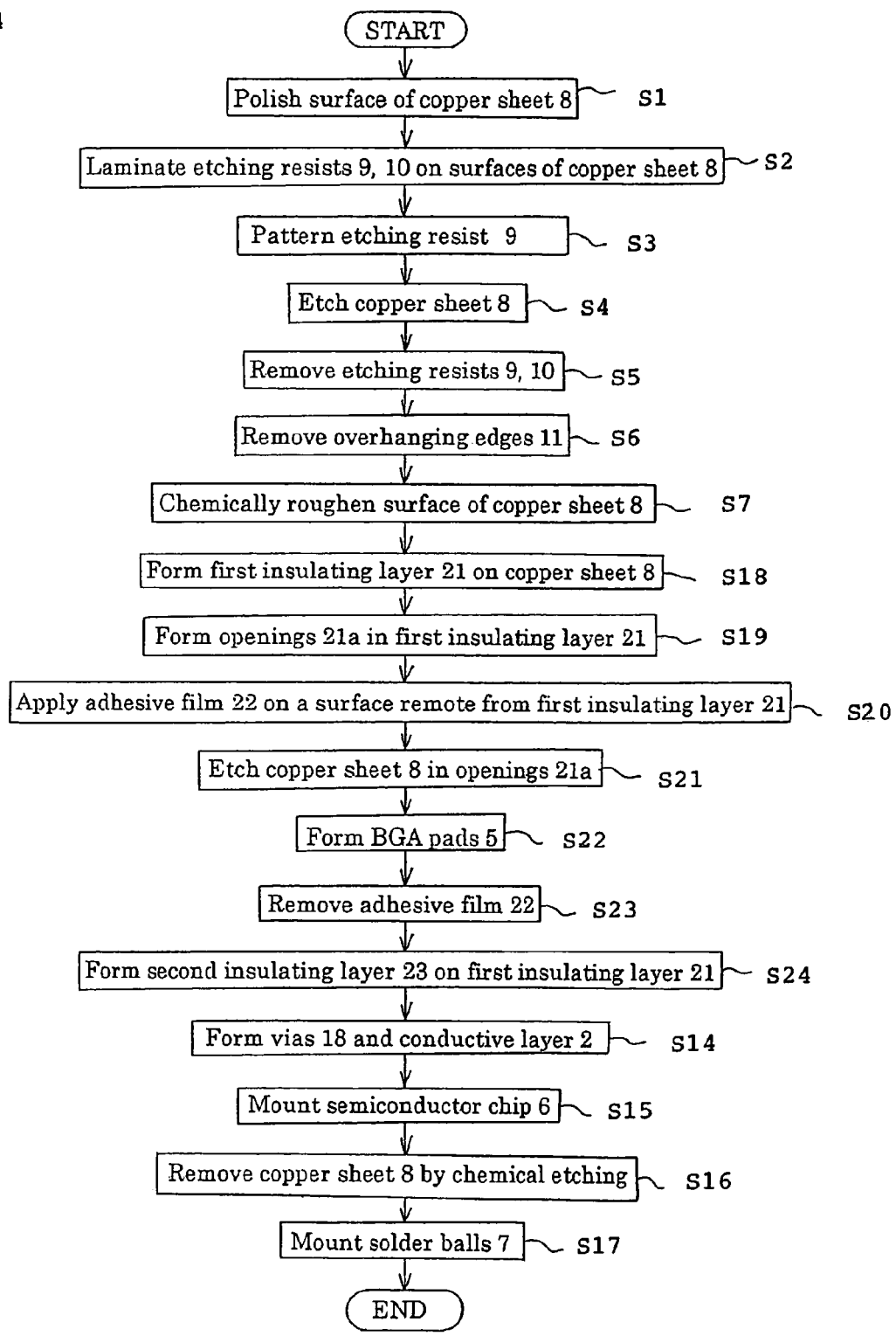
FIG. 14 is a flowchart of the method of fabricating a semiconductor device according to the second embodiment of the present invention.

Thereafter, as shown in FIG. 13E, copper sheet 8 is removed by chemical etching in step S16, thus exposing BGA pads 5. Finally, solder balls 7 are mounted for connection with another board in step S17. In this manner, semiconductor device 1 in a BGA package type as shown in FIG. 4 is completed.

In the present embodiment, overhanging edges on the surface of metal sheet 8 are removed to eliminate sharp corners therefrom. Therefore, insulating layer 3 formed using metal sheet 8 as a matrix sheet is free of sharp corners. Accordingly, semiconductor device 1 is protected from damage or fracture which would otherwise be caused by stresses concentrate on such sharp corners. As insulating layer 3 has a gently curved surface, any stresses applied are distributed and lessened. Since insulating layer 3 is not divided into a solder resist and an insulating layer lying therebeneath and is made of the same material according to the same process, insulating layer 3 is not damaged by strains due to stresses, is of a simple structure, and can be manufactured at a low cost. Since plating resist 12 is patterned by photolithography, a number of openings 12a for forming BGA pads 5 therein can easily be formed altogether.

2nd Embodiment

A method of fabricating semiconductor device 1 according to a second embodiment will be described below with reference to FIGS. 10A through 10E, 11A through 11C, 14, 15A through 15F, and 16A through 16E. Those steps which are identical to those of the method according to the first embodiment will be described only briefly.

As with the first embodiment, the surface of copper sheet 8 shown in FIG. 10A is polished in step S1, and as shown in FIG. 10B, etching resists 9, 10 are laminated on respective opposite surfaces of copper sheet 8 in step S2. As shown in FIG. 10C, etching resist 9 on one surface of copper sheet 8 is patterned in step S3. Then, as shown in FIG. 10D, the areas of copper sheet 8 which are not covered with etching resist 9 are etched to a uniform depth in step S4. Then, as shown in FIG. 10E, photosensitive etching resists 9, 10 are removed in step S5. Then, as shown in FIGS. 11A through 11DC, the entire surface of copper sheet 8 is etched again to remove overhanging edges 11 in step S6. A copper roughening liquid comprising sulfuric acid, hydrogen peroxide, and alkylimidazole is applied to etch the surface of copper sheet 8 to a depth ranging from 1 to 2 μm, thus chemically roughening copper sheet 8 in step S7. Copper sheet 8 is thus chemically roughened for increasing the intimate adhesion of first insulating layer 21 to be formed in a next process. Copper sheet 8 may be chemically roughened by a black oxide process or a brown oxide process.

Figure 15A:
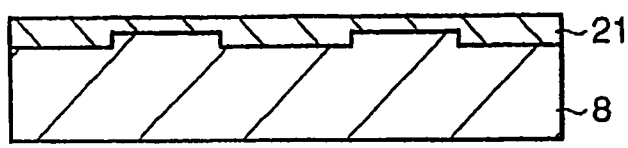
FIGS. 15A through 15F are cross-sectional views illustrative of middle steps of the method of fabricating a semiconductor device according to the second embodiment of the present invention.

Then, a previously prepared resin sheet with a copper foil, which has an insulating resin layer having a thickness ranging from 35 to 80 μm and coated with an epoxy resin which is then partly cured, is placed on copper sheet 8 and laminated by a vacuum hydraulic press. The copper foil is then removed by a known copper etching process, forming first insulating layer 21 in step S18, as shown in FIG. 15A. First insulating layer 21 is not limited to a layer produced from a resin sheet with a copper foil. Instead of a resin sheet with a copper foil, a prepare and a copper foil may be subjected to laminating press process, and then the copper foil may be etched. Alternatively, an insulating resin sheet may be laminated in a vacuum and then hot cured into an insulating layer.

Figure 15B:
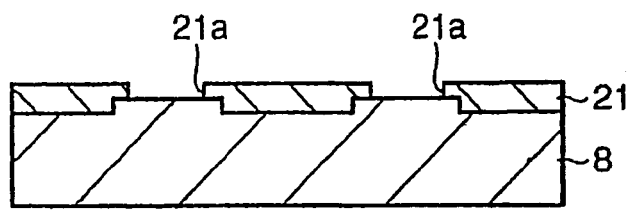

Then, the assembly is irradiated with a carbon gas laser beam or an UV-YAG laser beam to form openings 21a which reach the surface of copper sheet 8, in first insulating layer 21, in step S19, as shown in FIG. 15B. Since epoxy resin scum produced by the laser beam is deposited on the bottom of openings 21a, such epoxy resin scum is then removed by a desmearing process.

Figure 15C:
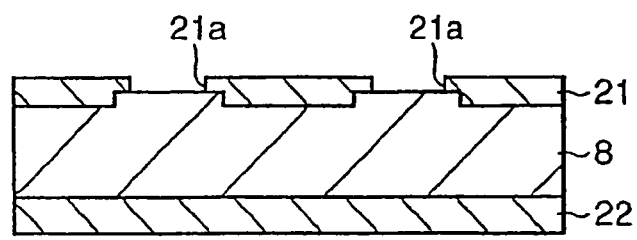

Adhesive film 22 is applied to mask the entire surface of copper sheet 8 remote from first insulating layer 21 in step S20. As shown in FIG. 15C, therefore, first insulating layer 21 having openings 21a aligned with the positions of BGA pads 5 to be formed subsequently is formed on one surface of copper sheet 8, and the other surface of copper sheet 8 is entirely covered with adhesive film 22.

Figure 15D:
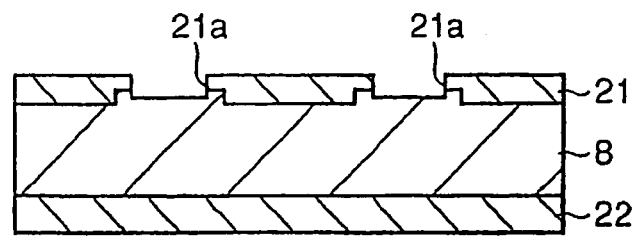

Then, an etchant comprising ferric chloride and hydrochloric acid is sprayed while being swung over copper sheet 8 to etch the areas of copper sheet 8 which are exposed in openings 21a in first insulating layer 21, to a uniform depth, in step S21, as shown in FIG. 15D. The etching depth is set by adjusting the etching time depending on the pitch and diameter of BGA pads 5 in semiconductor device 1 which will finally be completed.

Figure 15E:
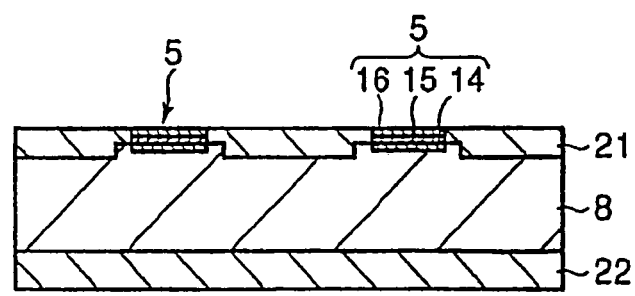
Figure 15F:
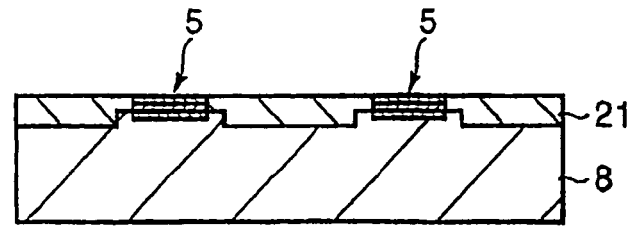

Then, an electroplating process is carried out using copper sheet 8 as a cathode, as with the first embodiment, producing BGA pads 5 comprising gold plated layer 14, nickel plated layer 15, and copper plated layer 16, in step S22, as shown in FIG. 15E. As shown in FIG. 15F, adhesive film 22 is then removed from copper sheet 8 in step S23.

Figure 16A:
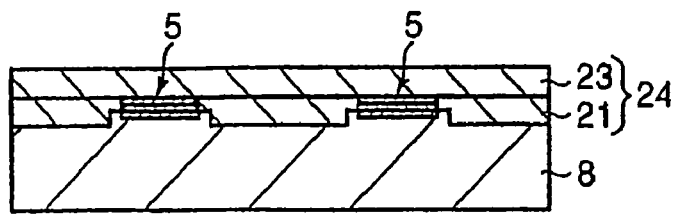
FIGS. 16A through 16E are cross-sectional views illustrative of latter steps of the method of fabricating a semiconductor device according to the second embodiment of the present invention.

Then, a resin sheet with a copper foil, which has an insulating resin layer having a thickness ranging from 35 to 80 μm and coated with an epoxy resin which is then partly cured, is placed on first insulating layer 21 and subjected to laminating press process. The copper foil is then removed by a copper etching process, forming second insulating layer 23 in step S24, as shown in FIG. 16A. In the second embodiment, therefore, two-layer insulating layer (interlayer insulating layer) 24 comprising first insulating layer 21 and second insulating layer 23 is constructed.

Figure 16B:
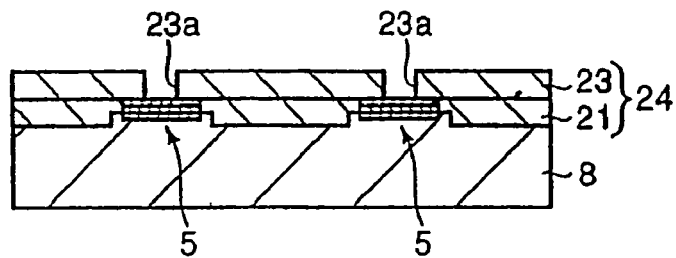
Figure 16C:
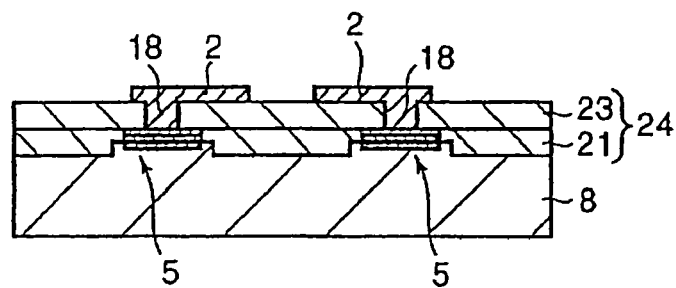

Then, as shown in FIG. 16B, via holes 23a are formed in second insulating layer 23, and epoxy resin scum is removed therefrom by a desmearing process. Using copper sheet 8 as a cathode, an electric copper plating process is carried out to form a plated layer, which is patterned, producing vias 18 embedded in via holes 23a and conductive layer 2 serving as circuits in step S14, as shown in FIG. 16C.

Figure 16D:
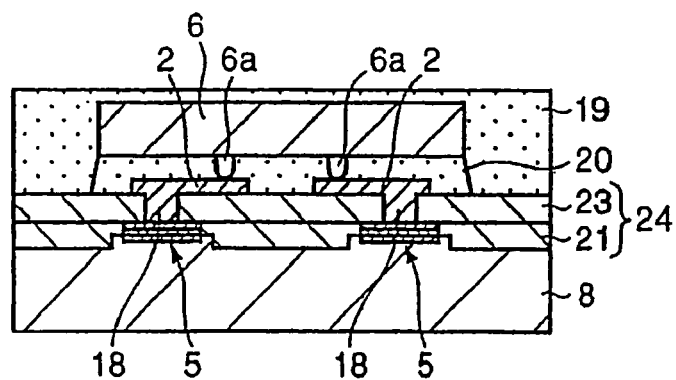
Figure 16E:
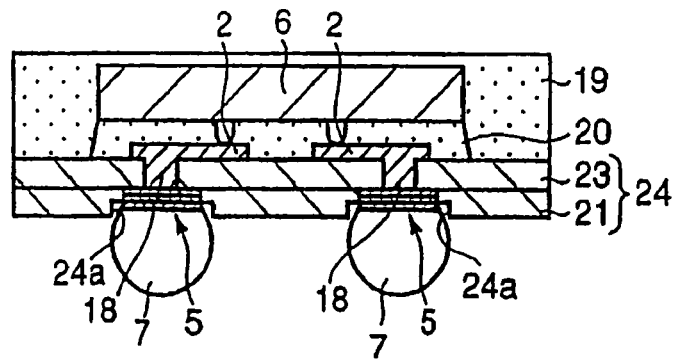
Figure 17:
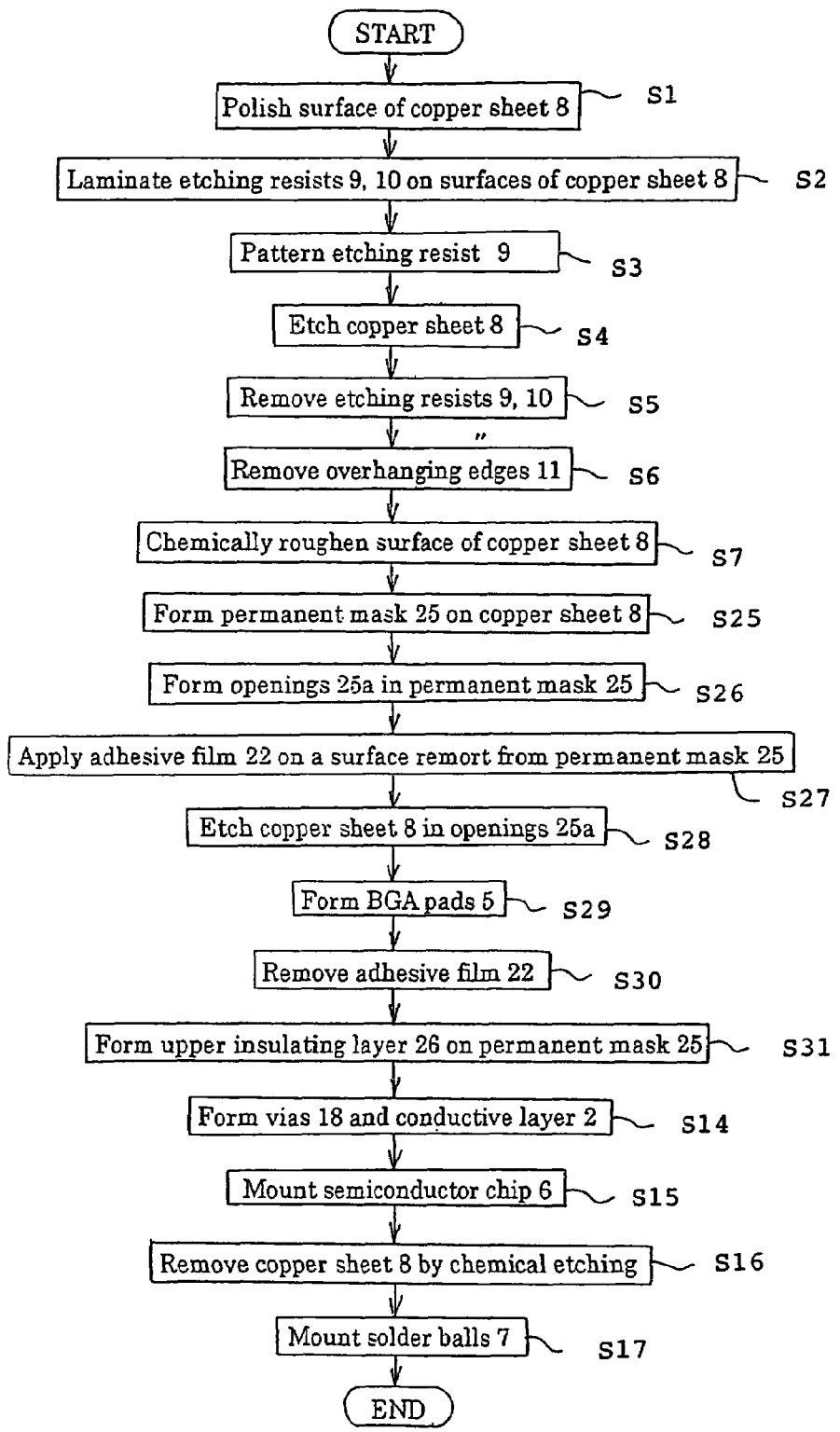
FIG. 17 is a flowchart of the method of fabricating a semiconductor device according to the third embodiment of the present invention.

Then, as shown in FIG. 16D, semiconductor chip 6 connected to conductive layer 2 is mounted in place in step S15. Thereafter, copper sheet 8 is removed by chemical etching in step S16, and then solder balls 7 are mounted in place in step S17, as shown in FIG. 16E. In this manner, semiconductor device in a BGA package type is completed.

In the second embodiment, recesses 24a are formed in two-layer insulating layer which comprises first insulating layer 21 and second insulating layer 23. When BGA pad 5 is shown as facing upwardly, the upper surface of BGA pad 5 projects upwardly from the bottom of recess 24a in insulating layer 24 and is positioned lower than the upper surface of insulating layer 24. Therefore, both the productivity of a process of mounting solder ball 7 and the bonding strength between solder ball 7 and BGA pad 5 are increased.

In the second embodiment, furthermore, since first insulating layer 21 is not removed and second insulating layer 23 is formed on first insulating layer 21, insulating layer 24 is excellently smooth in its entirety.

3rd Embodiment

A method of fabricating semiconductor device 1 according to a third embodiment will be described below with reference to FIGS. 10A through 10E, 11A through 1C, 17, 18A through 18F, and 19A through 19E. Those steps which are identical to those of the methods according to the first and second embodiments will be described only briefly.

Figure 11C:
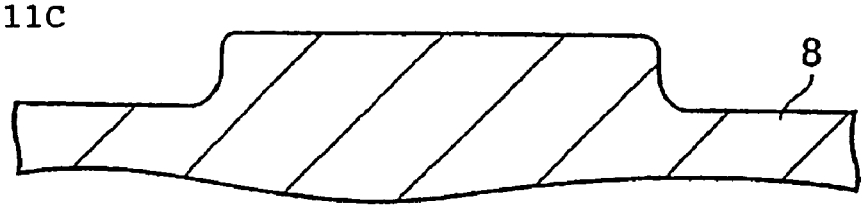

As with the first and second embodiments, the surface of copper sheet 8 shown in FIG. 10A is polished in step S1, and as shown in FIG. 10B, etching resists 9, 10 are laminated on respective opposite surfaces of copper sheet 8 in step S2. As shown in FIG. 10C, etching resist 9 on one surface of copper sheet 8 is patterned in step S3. Then, as shown in FIG. 10D, the areas of copper sheet 8 which are not covered with etching resist 9 are etched to a uniform depth in step S4. Then, as shown in FIG. 10E, photosensitive etching resists 9, 10 are removed in step S5. Then, as shown in FIGS. 11A through 11C, the entire surface of copper sheet 8 is etched again to remove overhanging edges 11 in step S6. A copper roughening liquid comprising sulfuric acid, hydrogen peroxide, and alkylimidazole is applied to etch the surface of copper sheet 8 to a depth ranging from 1 to 2 μm, thus chemically roughening copper sheet 8 in step S7. Copper sheet 8 is thus chemically roughened for increasing the intimate adhesion of permanent mask 25 to be formed in a next process. Copper sheet 8 may be chemically roughened by a black oxide process or a brown oxide process.

Figure 18A:
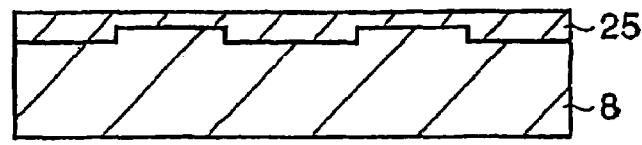
FIGS. 18A through 18F are cross-sectional views illustrative of middle steps of the method of fabricating a semiconductor device according to the third embodiment of the present invention.

Permanent mask resin 25 in a liquid phase is applied to one surface of copper sheet 8 by a spin coater. In the present embodiment, as shown in FIG. 18A, PVI-500 (trade name) manufactured by Taiyo Ink Mfg. Co., Ltd., which is an alkali-developed photosensitive resin for forming a permanent mask, is applied to one surface of copper sheet 8, and then the solvent is volatilized to reduce its thickness to 40 μm in step S25.

Figure 18B:
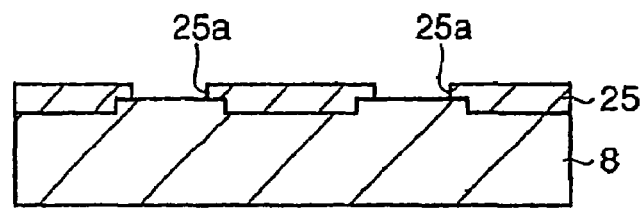

Thereafter, a mask film (not shown) having a pattern of circular openings aligned with the positions of BGA pads 5 to be formed subsequently is held against permanent mask resin 25. Then, permanent mask resin 25 is exposed to an ultraviolet radiation, and processed in a development process by an aqueous solution of sodium carbonate, eluting unexposed areas of permanent mask resin 25 thereby to pattern permanent mask resin 25 to form openings 25a in step S26. As shown in FIG. 18B, permanent mask 25 having openings 25a aligned with the positions of BGA pads 5 to be formed subsequently is formed on one surface of copper sheet 8.

Figure 18C:
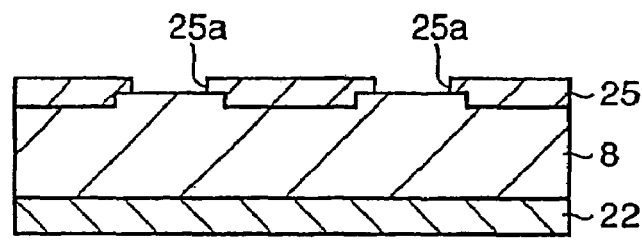

Adhesive film 22 is applied to mask the entire surface of copper sheet 8 remote from permanent mask 25 in step S27. As shown in FIG. 18C, therefore, permanent mask 25 having openings 25a aligned with the positions of BGA pads 5 to be formed subsequently is formed on one surface of copper sheet 8, and the other surface of copper sheet 8 is entirely covered with adhesive film 22.

Figure 18D:
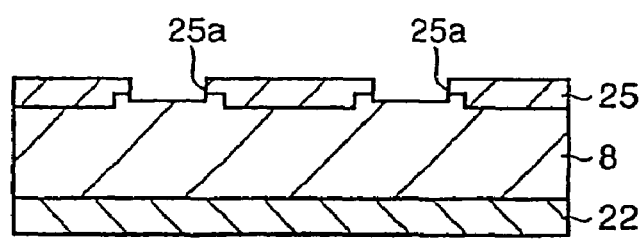

Then, an etchant comprising ferric chloride and hydrochloric acid is sprayed while being swung over copper sheet 8 to etch the areas of copper sheet 8 which are exposed in openings 25a in permanent mask 25, to a uniform depth, in step S28, as shown in FIG. 18D. The etching depth is set by adjusting the etching time depending on the pitch and diameter of BGA pads 5 in semiconductor device 1 which will finally be completed.

Figure 18E:
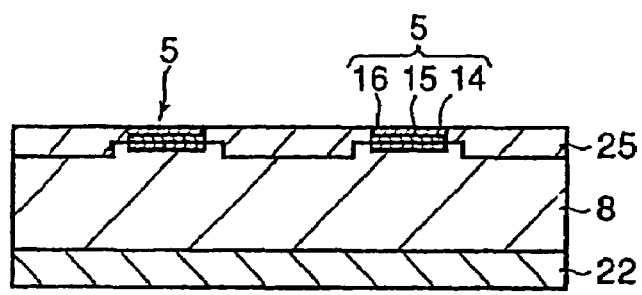
Figure 18F:
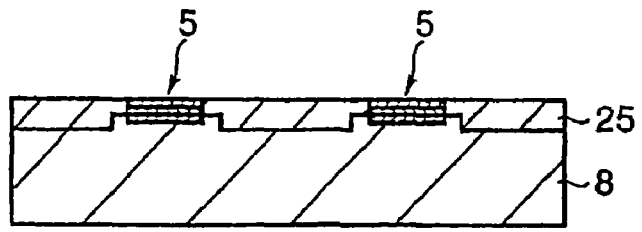

Then, an electroplating process is carried out using copper sheet 8 as a cathode, as with the first embodiment, producing BGA pads 5 comprising gold plated layer 14, nickel plated layer 15, and copper plated layer 16, in step S29, as shown in FIG. 18E. As shown in FIG. 18F, adhesive film 22 is then removed from copper sheet 8 in step S30.

Figure 19A:
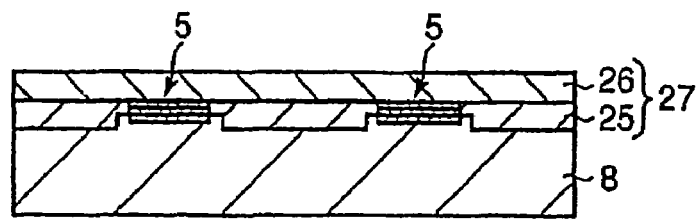
FIGS. 19A through 19E are cross-sectional views illustrative of latter steps of the method of fabricating a semiconductor device according to the third embodiment of the present invention.

Then, a resin sheet with a copper foil, which has an insulating resin layer having a thickness ranging from 35 to 80 μm and coated with an epoxy resin which is then partly cured, is placed on permanent mask 25 and subjected to laminating press process. The copper foil is then removed by a copper etching process, forming upper insulating layer 26 in step S31, as shown in FIG. 19A. In the third embodiment, therefore, two-layer insulating layer (interlayer insulating layer) 27 comprising permanent mask 25 and upper insulating layer 26 is constructed.

Figure 19B:
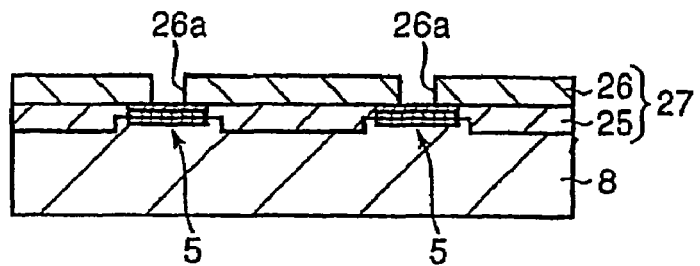
Figure 19C:
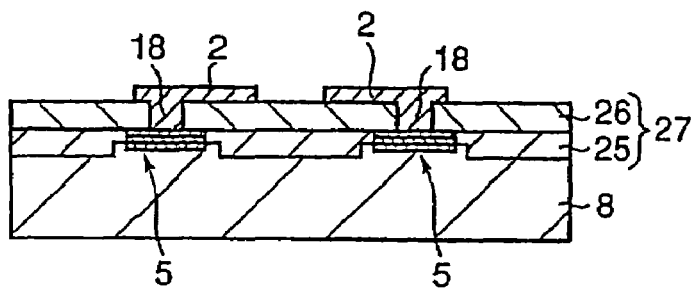

Then, as shown in FIG. 19B, via holes 26a are formed in upper insulating layer 26, and epoxy resin scum is removed therefrom by a desmearing process. Using copper sheet 8 as a cathode, an electric copper plating process is carried out to form a plated layer, which is patterned, producing vias 18 embedded in via holes 26a and conductive layer 2 serving as circuits in step S14, as shown in FIG. 19C.

Figure 19D:
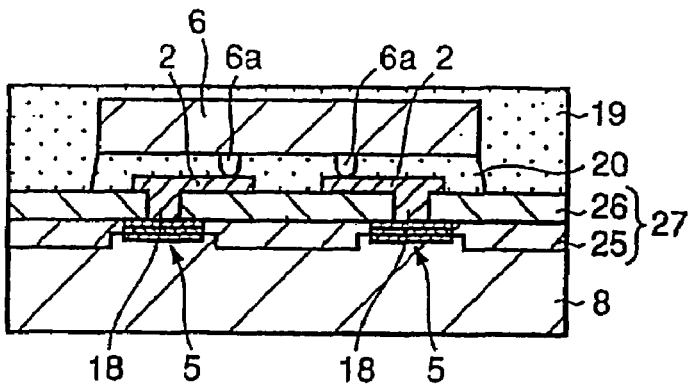
Figure 19E:
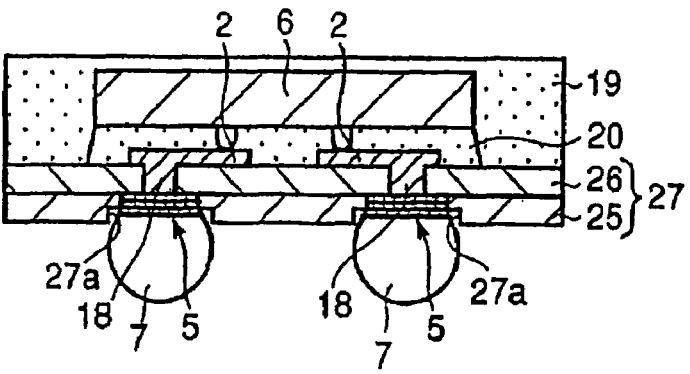

Then, as shown in FIG. 19D, semiconductor chip 6 connected to conductive layer 2 is mounted in place in step S15. Thereafter, copper sheet 8 is removed by chemical etching in step S16, and then solder balls 7 are mounted in place in step S17, as shown in FIG. 19E. In this manner, semiconductor device in a BGA package type is completed.

In the third embodiment, recesses 27a are formed in two-layer insulating layer 27 which comprises permanent mask 25 and upper insulating layer 26. When BGA pad 5 is shown as facing upwardly, the upper surface of BGA pad 5 projects upwardly from the bottom of recess 27a in insulating layer 27 and is positioned lower than the upper surface of insulating layer 27. Therefore, both the productivity of a process of mounting solder ball 7 and the bonding strength between solder ball 7 and BGA pad 5 are increased.

In the third embodiment, furthermore, since permanent mask 25 is not removed and upper insulating layer 26 is formed on permanent mask 25, insulating layer 27 is excellently smooth in its entirety. Since permanent mask 25 is patterned by photolithography, a number of openings 25a for forming BGA pads 5 therein can easily be formed altogether.

In the first through third embodiments, copper sheet 8 is removed after semiconductor chip 6 is mounted in place. However, semiconductor chip 6 may be mounted in place after copper sheet 8 is removed. In the second and third embodiments, the timing to remove adhesive film 22 is not limited to the illustrated timing, but may be anytime after the etching of copper sheet 8 in steps S21, S28.

While preferred embodiments of the present invention have been described in specific terms, such description is for illustrative purposes only, and it is to be understood that changes and variations may be made without departing from the spirit or scope of the following claims.

What is claimed is:

1. A method of fabricating a board for mounting a semiconductor chip thereon, said method comprising the steps of:
    forming an etching resist pattern at a portion that corresponds to a position for an electrode pad on one surface of a matrix sheet which is a metal plate;
    etching said one surface of said metal plate to make the portion of said metal plate, which is covered by said etching resist pattern, convex shape;
    peeling and removing said etching resist pattern;
    forming a plating resist on said one surface of said metal plate, said plating resist having an opening which has a smaller diameter than the diameter of said convex-shaped portion at a portion that corresponds to a position for the electrode pad;
    etching an exposed portion of said metal plate through said opening of said plating resist to make a recessed portion on a surface of said convex-shaped portion;
    forming an electroplating layer at said recessed portion to form the electrode pad which protrudes from said surface of said convex-shaped portion;
    peeling and removing said plating resist;
    forming an insulating layer of insulating resin on said surface of said metal plate on which said electrode pad is formed, by a single process using a single material;
    forming a via hole in said insulating layer;
    forming a via in said via hole in said insulating layer by plating;
    forming a conductive layer by plating on a surface of said insulating layer remote from said metal plate, said conductive layer being connected to said electrode pad through said via; and
    removing said metal plate by etching,
    wherein a pattern of recess and land is transferred from said surface of said metal plate to a surface of said insulating layer in order to form a recess on said insulating layer and to position said electrode pad in said recess so that the outer periphery of said electrode pad is located away from the inner periphery of said recess and a surface of said electrode pad is positioned between a bottom surface of said recess and said surface of said insulating layer.

2. A method according to claim 1, wherein an overhanging portion of said convex-shaped portion of said metal plate and a corner portion of said metal plate are removed and then said insulating layer is formed in said step of forming said insulating layer after said step of peeling and removing said plating resist.

* * * * *